United States Patent [19]

Alexander et al.

[11] Patent Number: 5,823,005

[45] Date of Patent: *Oct. 20, 1998

[54] FOCUSED AIR COOLING EMPLOYING A DEDICATED CHILLER

[75] Inventors: Arthur Ray Alexander, Valley Center; Warren W. Porter, deceased, late of Escondido, both of Calif., by Carla D. Porter, legal representative

[73] Assignee: NCR Corporation, Dayton, Ohio

[*] Notice: The term of this patent shall not extend beyond the expiration date of Pat. No. 5,473,508.

[21] Appl. No.: 778,706

[22] Filed: Jan. 3, 1997

[51] Int. Cl.⁶ .............................. F25D 23/12; H05K 7/20
[52] U.S. Cl. .......................... 62/259.2; 62/401; 361/695; 361/691
[58] Field of Search .......................... 62/259.2, 86, 401, 62/404, 406; 361/691, 692, 693, 696, 697, 719, 695

[56] References Cited

U.S. PATENT DOCUMENTS

| | | | |
|---|---|---|---|
| 4,352,274 | 10/1982 | Anderson et al. | 62/229 |
| 4,674,004 | 6/1987 | Smith et al. | 361/693 |
| 5,067,047 | 11/1991 | Azar | 361/691 |
| 5,183,104 | 2/1993 | Novotny | 165/104.33 |
| 5,365,749 | 11/1994 | Porter | 62/259.2 |
| 5,467,607 | 11/1995 | Harvey | 62/186 |
| 5,469,711 | 11/1995 | McCoy | 62/51.1 |
| 5,473,508 | 12/1995 | Porter et al. | 361/695 |
| 5,509,468 | 4/1996 | Lopez | 165/144 |
| 5,581,441 | 12/1996 | Porter | 361/701 |

FOREIGN PATENT DOCUMENTS

| | | | |
|---|---|---|---|
| 3244654 | 3/1983 | Germany | 62/259.2 |

*Primary Examiner*—William Doerrler
*Attorney, Agent, or Firm*—Merchant, Gould, Smith, Edell, Welter & Schmidt

[57] ABSTRACT

A cooling system for cooling computer components generating thermal energy. The cooling system includes a high efficiency heat exchanger attached to the heat producing component and an evaporator. The heat exchanger comprises a hollow body formed of a thermally conductive material having a coolant inlet and a coolant outlet. A periodically lanced metal fin is located within the hollow body and is oriented between the inlet and outlet to provide maximum contact of the coolant along the surface area of the metal fin. An evaporator is attached to the inlet of the heat exchanger to pre-cool the air flow delivered to the heat exchanger and thus the heat generating component.

14 Claims, 8 Drawing Sheets

FOCUSED AIR COOLING EMPLOYING A DEDICATED CHILLER

BACKGROUND OF THE INVENTION

1. Field of Invention

The present invention relates generally to cooling systems for electrical components, and more particularly, to an apparatus and method for cooling heat producing components in computer systems.

2. Description of Related Art

The increase in circuit density and operating frequency of integrated circuits and multi-chip modules utilized in present day computer systems has resulted in an exponential increase in the power dissipated by those components. For example, just a few years ago the maximum power generated by a typical complementary metal oxide semiconductor (CMOS) central processor unit (CPU) utilized within a personal computer was in the neighborhood of two watts. Currently, the INTEL™ PENTIUM™ processor dissipates an estimated sixteen (16) watts, and the next generation INTEL™ Corporation processor is estimated to generate nearly thirty (30) watts. Cooling arrangements must be provided to prevent damage to these integrated circuits from the high temperatures generated by the devices. In addition to cooling to prevent damage resulting from overheating, it is known that a CMOS circuit will operate at higher clock speeds as the circuit temperature is lowered. In some cases the processor frequency of the CMOS processor has been improved to near 300% through the cooling of the processor die to a temperature of approximately −200 degrees C. Although many methods for cooling processors and other computer components are known, most traditional air cooling techniques, such as natural or forced air convection into the atmosphere, are no longer adequate to provide the heat removal required for these high power integrated circuits.

OBJECTS AND SUMMARY OF THE INVENTION

It is therefore an object of the present invention to provide a new and useful cooling system for a computer system which is not subject to the above disadvantages. It is another object of the present invention to provide a new, useful and highly efficient focused air cooling system for a multi-processor computer system. It is still a further object of the present invention to provide a focused air cooling system employing both a high efficiency heat exchanger and an expansion device attached to each processor within a multi-processor computer system. It is an additional object of the present invention to provide a new and useful cooling system which provides a consistent cooling air flow to the processors within a multiple processor computer system, thereby establishing a stable processor chip temperature. It is a further object of the present invention to provide a new and useful cooling system which provides consistent cooling of high power computer components regardless of the adjacent environment. It is also an object of the present invention to provide a new and useful heat exchanger/expansion device combination for use within an air cooling system, the expansion device providing pre-cooled air to the heat exchanger which thereby provides enhanced focused cooling of an attached integrated circuit.

There is provided, in accordance with the present invention, a focused air cooling system for a multiple processor computer system, including a vacuum pump, for providing a coolant airflow (or a compressor for providing a coolant airflow by use of a pressurized refrigerant), a heat exchanger thermally attached to each processor in the computer system, an expansion device attached to the heat exchanger to pre-cool the airflow delivered to the heat exchanger, and a conduit connecting the vacuum pump unit to each heat exchanger.

Each heat exchanger comprises a hollow body formed of a thermally conductive material for attachment to its corresponding processor; an internal cooling structure formed of a thermally conductive material for providing an increased surface area which is exposed to the coolant airflow provided to the heat exchanger, the cooling structure being thermally attached within the heat exchanger's hollow body, and a coolant airflow inlet and outlet provided through the wall of the hollow heat exchanger body for providing ingress and egress of coolant air. The outlet is connected to the conduit described above to complete the coolant airflow pathway between the heat exchanger and the vacuum pump.

In the described embodiment, the heat exchanger internal cooling structure comprises a corrugated metal fin which is periodically lanced to provide for the passage of coolant air through the fin. The metal fin occupies substantially all of the cavity within the heat exchanger's hollow body and is oriented such that the corrugations in the fin are positioned between the heat exchanger's inlet and outlet.

Each expansion device comprises a heat transfer. In the described embodiment, the expansion device comprises a path for the working fluid passing therethrough, a reservoir, and an orifice for effecting a pressure transformation. The expansion device provides pre-cooled air to the exchanger, further enhancing the cooling effect to the component enabling the efficient operation of devices in excess of 16 watts. Component reliability is also enhanced due to lower operating temperature.

The above and other objects, features, and advantages of the present invention will become apparent from the following description and the attached drawings.

BRIEF DESCRIPTION OF THE DRAWINGS

Throughout the following, reference numerals will be used in the drawings, and like reference numerals will be used throughout the several views in the description to indicate corresponding parts of the invention.

Figure 6:
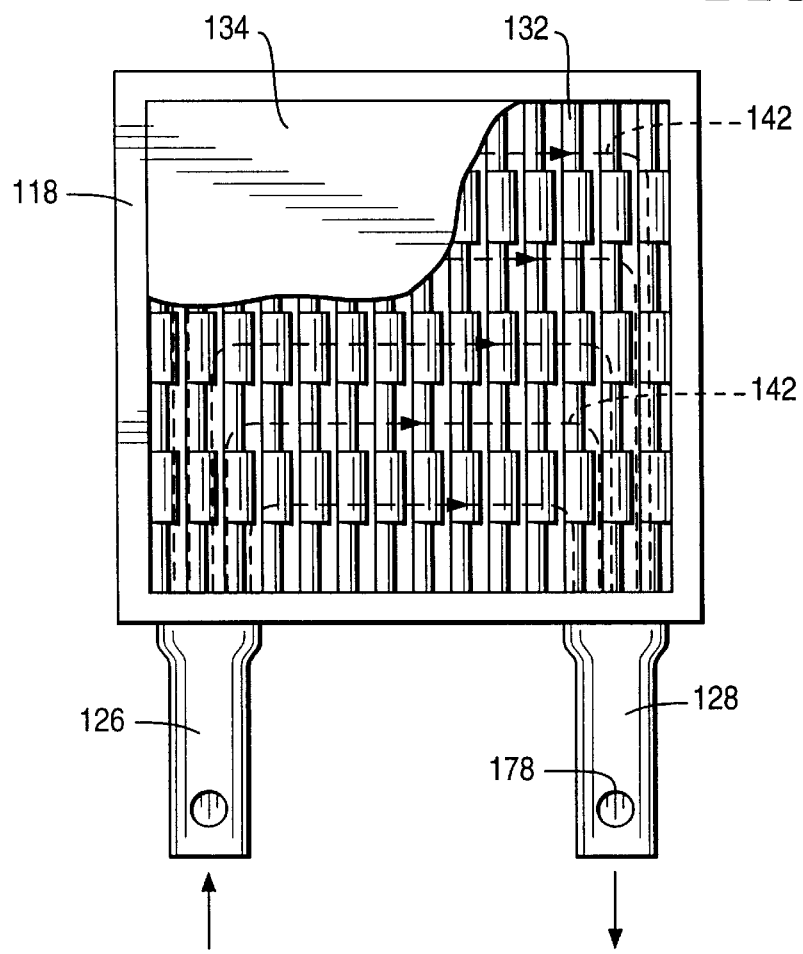
Figure 7:
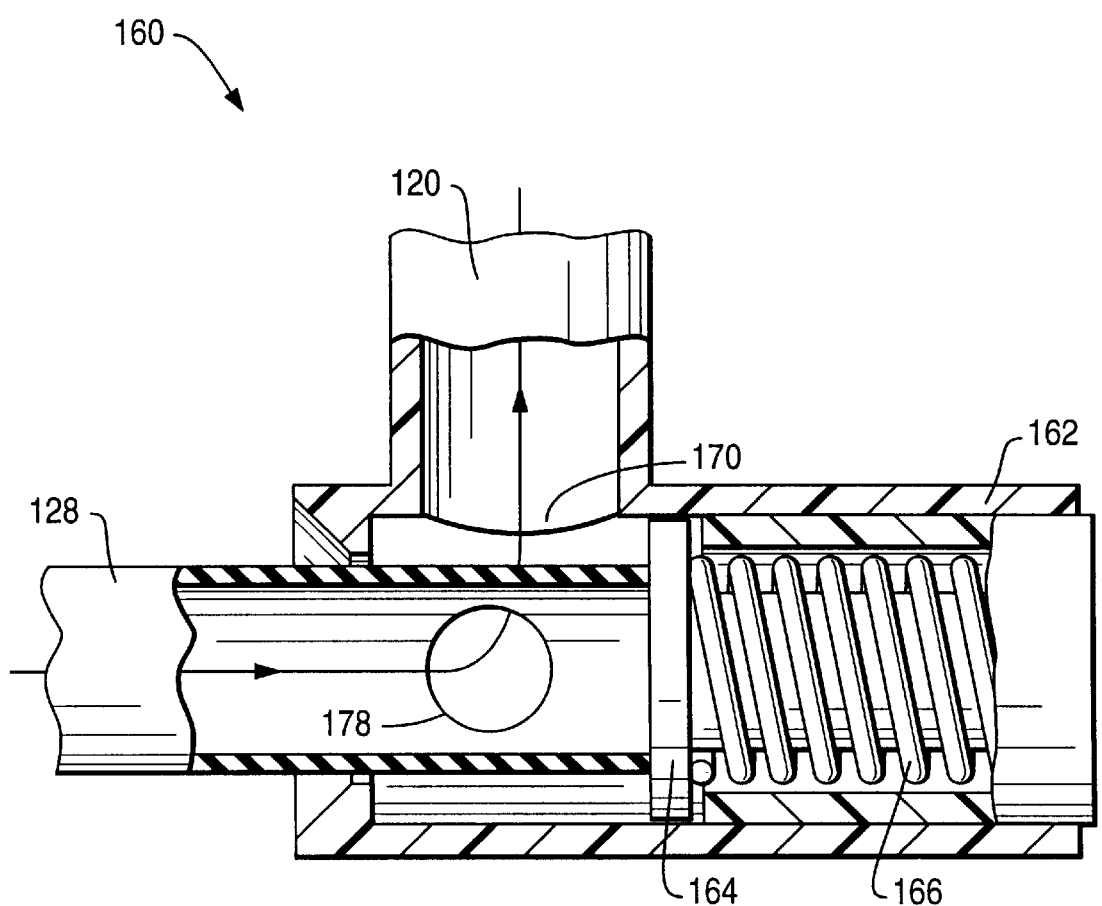
Figure 8:
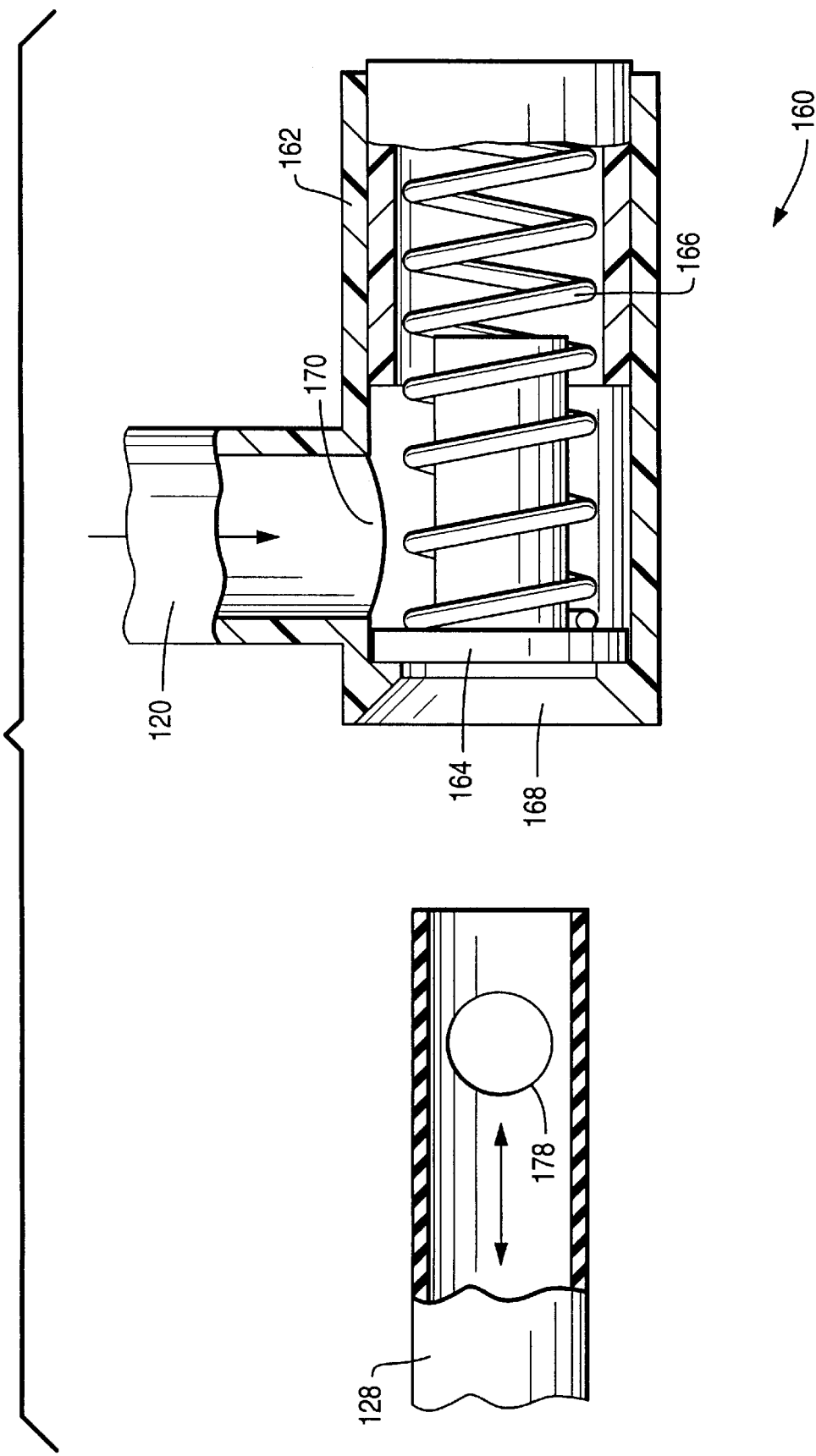
Figure 9:
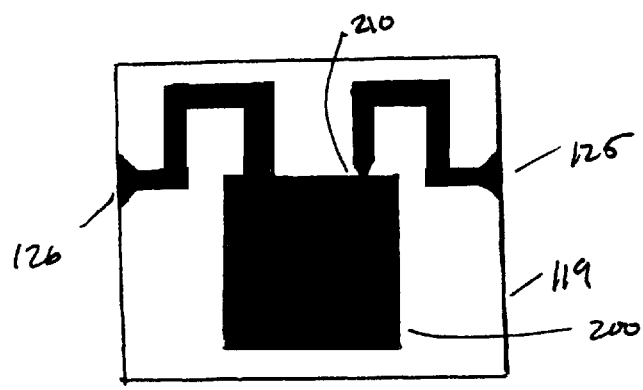

5 is a perspective view of the fin assembly component of the CPU heat exchanger;

FIG. 6 is a top view, partially cut away, of the CPU heat exchanging illustrating the flow of coolant air through the exchanger;

FIGS. 7 and 8 are sectional views of a quick-release air coupling device utilized to connect cooling conduits within the system of the present invention; and FIG. 9 is a top cut away of the expansion device.

DETAILED DESCRIPTION OF THE PREFERRED EMBODIMENT

Figure 1:
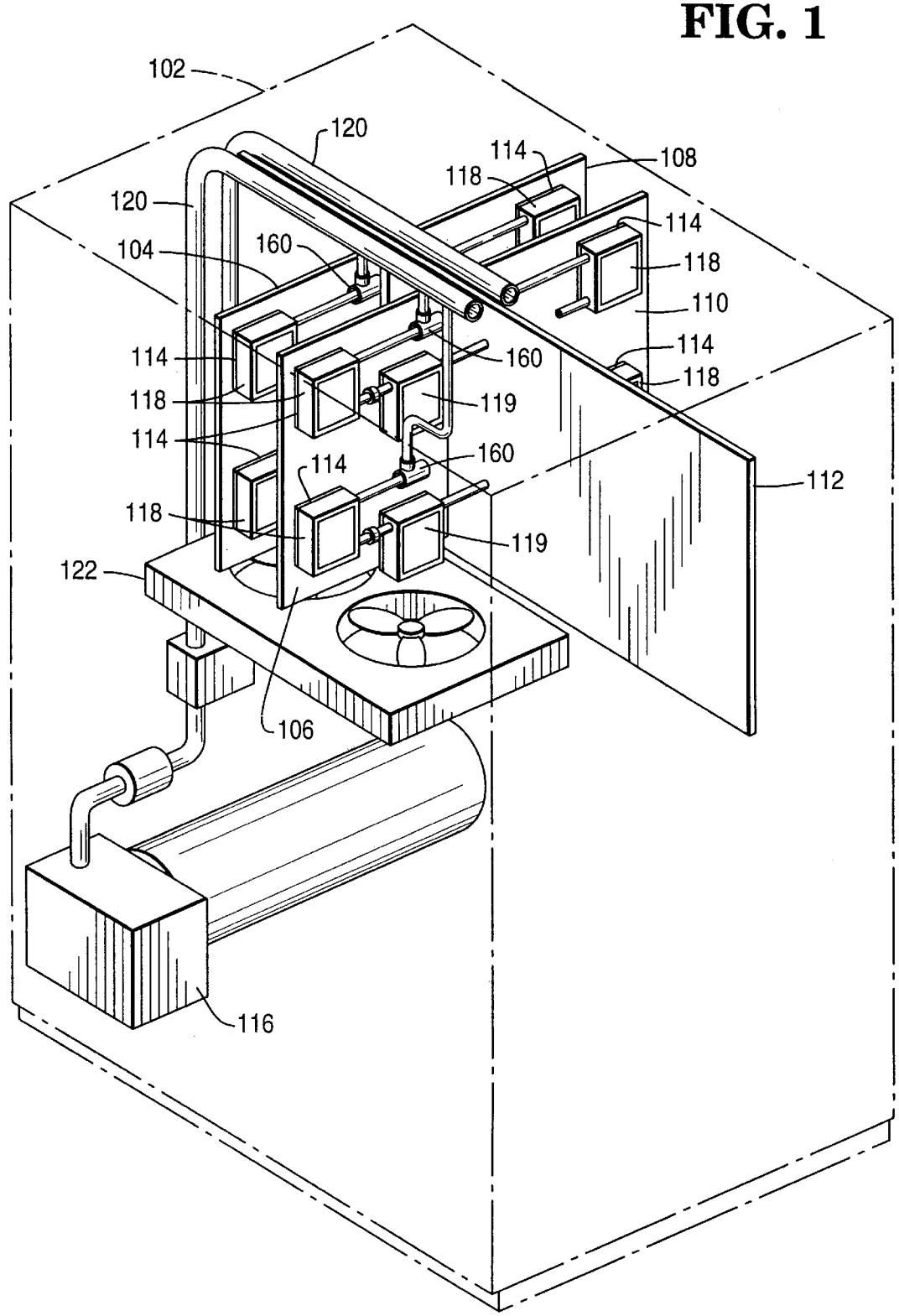
FIG. 1 is a perspective view of a processor cabinet including a plurality of printed circuit boards and the focused air cooling system according to the present invention.

FIG. 1 presents a diagram of a typical processor cabinet 102, shown in outline, which houses the components of a multiple processor computer system and includes a cooling system in accordance with the present invention. Only those components necessary for an understanding of the present invention are shown and discussed herein. The processor cabinetry may additionally house disk drives, power supplies, memory boards and other structures not shown in FIG. 1.

The computer system includes a plurality of processor boards, four of which are shown. These boards, identified by reference numerals 104, 106, 108 and 110, each include electrical contacts along one edge which are press fitted into mating connectors secured to the surface of a system backpanel 112, in a manner which is well known by those skilled in electronics technology. The backpanel provides common connections for the transmission of power, control and data signals between the various components of the computer system. The processor boards, which will be described in greater detail below with reference to FIG. 2, each include two processors or CPUs 114. Also shown in FIG. 1 is a typical fan panel 122 that generates an air flow directed upward across the processor boards and other components within the cabinet.

The primary components of the cooling system shown in FIG. 1 include a vacuum pump unit 116, a heat exchanger assembly 118 affixed to each processor 114, an expansion device 119 and an air distribution conduit 120 connecting each heat exchanger assembly with vacuum pump unit 116. The air distribution conduit 120 provides an air pathway between the vacuum pump unit 116 and the heat exchanger 118. To facilitate the installation, removal and replacement of processor boards, such as board 104, air coupling devices 160 are installed into each section of conduit 120 provided to the processor boards. Further, to facilitate installation, removal and replacement of the expansion devices 119, coupling devices 161 are installed between each heat exchanger 118 and expansion device 119. This structure permits connection or disconnection of the board mounted components with the cooling system concurrently with the electrical connection of the board mounted components with the system backpanel 112. Also provided in the invention as shown in FIG. 1, the vacuum pump unit 116 includes a reservoir, filter and pressure regulator to store, clean and control the air flow drawn through each processor, and is located in the bottom of cabinet 102 to facilitate disconnection of the vacuum pump unit from the conduit system for removal and service or replacement. Redundant vacuum pumps may be provided to increase the reliability of the cooling system.

Figure 2:
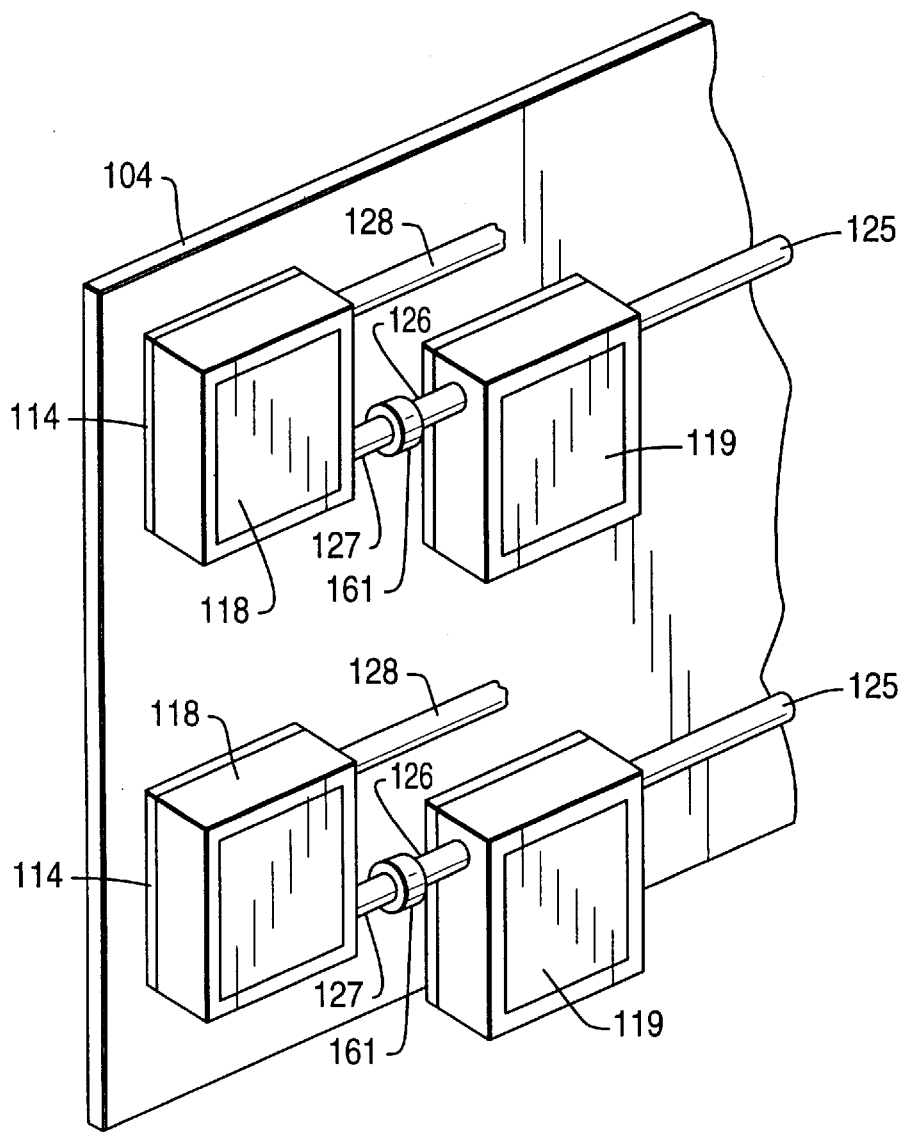
FIG. 2 is a printed circuit board subassembly, shown in perspective view, including two CPUs and corresponding CPU heat exchanger components and expansion device components of the cooling system of the present invention.

Processor board 104 is shown in perspective view in FIG. 2. The processor board is a printed circuit board to which is attached two CPUs 114 as well as other circuit elements which are not shown. It should be noted that although the processor boards are shown including two CPUs, one, two or more processors can be accommodated on each processor board and the cooling system, described herein, designed accordingly. Attached to each CPU is a heat exchanger assembly 118. The heat exchanger assembly 118 includes an air inlet 127 and an air outlet 128. An expansion device 119 is attached to each air inlet 127 by an air coupling device 161 and the vacuum pump 116 is attached to each air outlet 128 by an air distribution conduit 120.

Figure 3:
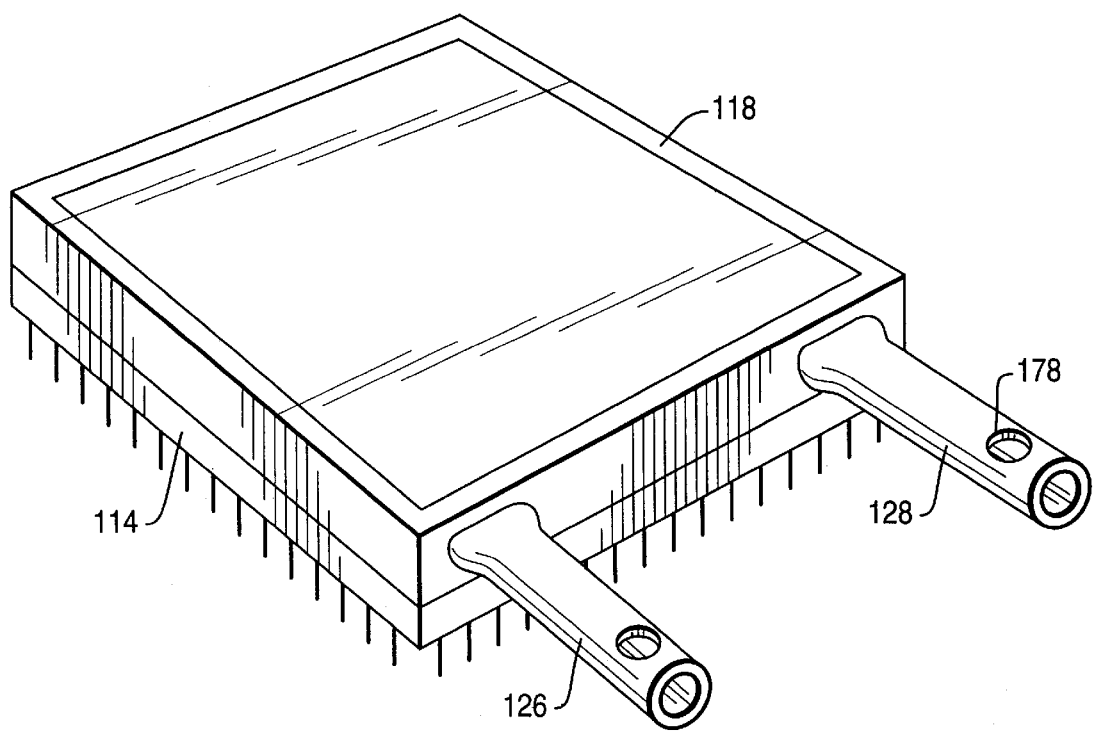
FIG. 3 is a perspective view of a single CPU together with its corresponding CPU heat exchanger.

The construction of heat exchanger assembly 118 will now be described with reference to FIGS. 3 through 6. FIG. 3 is a perspective view of a single CPU together with its corresponding CPU heat exchanger. The heat exchanger assembly 118 is formed of a thermally conductive material and is thermally mated to the top surface of CPU 114 using, for example, a thermalepoxy that provides a thermal and mechanical bond. Alternatively, a thermal grease may be utilized together with a spring loaded retainer or some other means of mechanical attachment to thermally mate heat exchanger assembly 118 with CPU 114. As noted above, the heat exchanger assembly includes an air inlet 126 and an air outlet 128 which provide for the entry and exit, respectively, of a cooling airflow.

Figure 4:
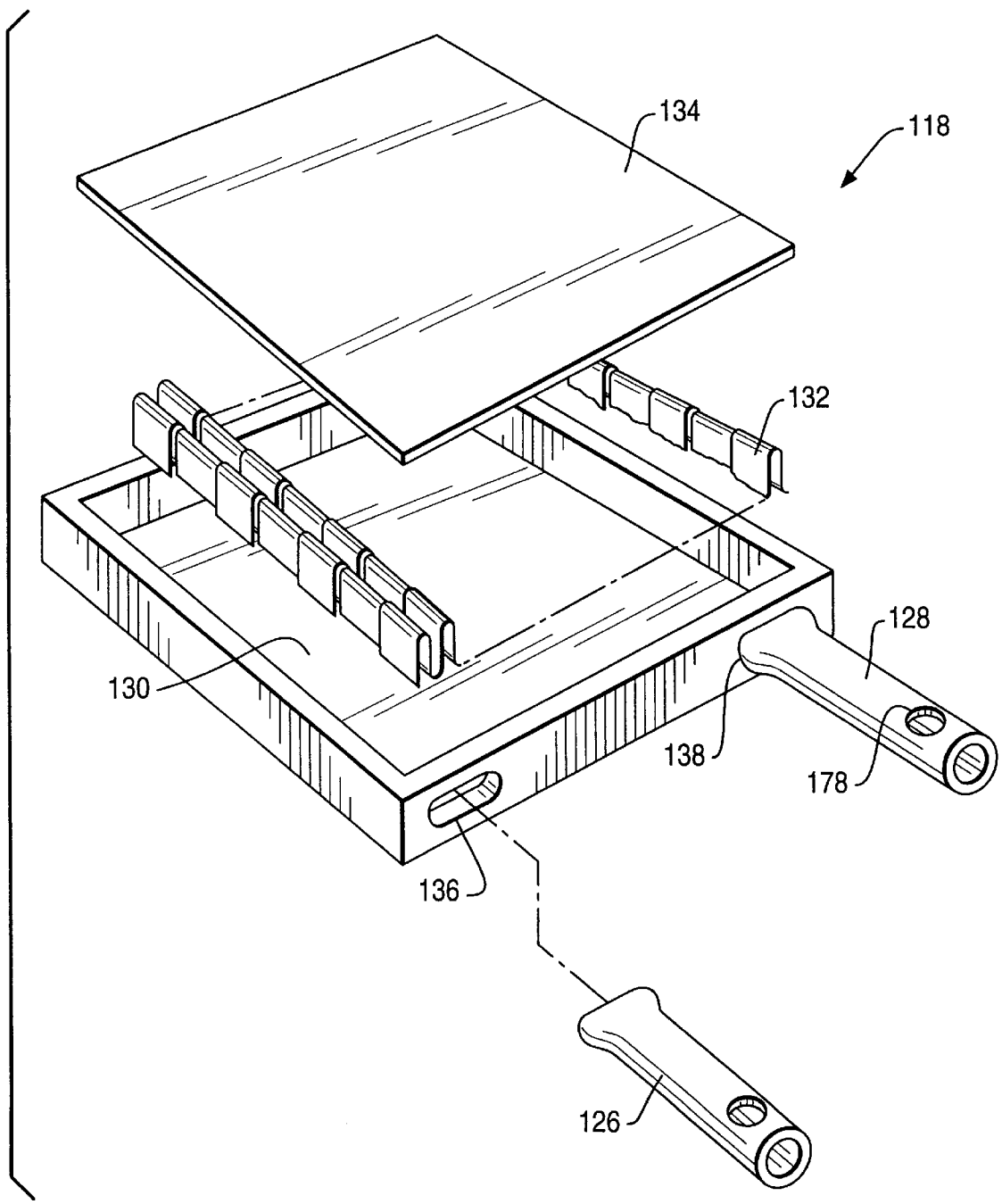
FIG. 4 is a disassembled perspective view of the CPU heat exchanger.

The CPU heat exchanger assembly 118 is shown disassembled in FIG. 4. In the embodiment shown, the heat exchanger assembly includes a hollow body 130, a corrugated metal fin 132; a metal lid 134; and two metal tubes forming the air inlet 127 and air outlet 128. Two openings 136 and 138 are provided through the wall of the heat exchanger body into the hollow chamber within the body. Air inlet 127 and outlet 128 are installed into openings 136 and 138, respectively. Metal fin 132 is installed inside hollow body 130 with the corrugations oriented in the same directions as the air inlet and outlet tubes 127 and 128, and covered by metal lid 134. All of the heat exchanger parts are made of metal and are soldered or brazed together into an inseparable assembly. Heat exchanger body 130, metal fin 132 and lid 134 must have a complete solder or braze interface to maximize heat transfer characteristics of the exchanger assembly. Additionally, the solder or braze joints between exchanger body 130, lid 134, air inlet 126 and air outlet 128 must be impenetrable to the flow of gas and liquid.

Figure 5:
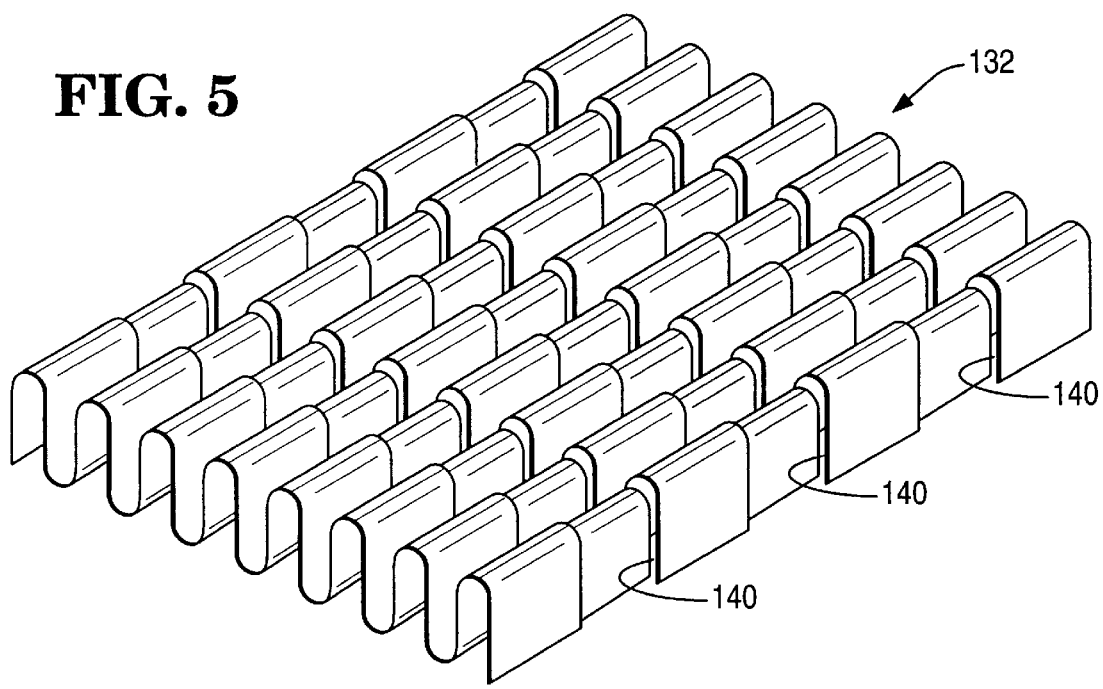

Corrugated metal fin 132, shown in perspective view in FIG. 5, is a commercially available thin metal fin. Although many configurations of the metal fin are available, the heat exchanger described herein employs a metal fin fabricated from 0.004 inch thick brass having approximately twenty-five corrugations per inch and a height of 0.120 inch. Metal fin 132 is lanced repeatedly resulting in periodic perforations 140 in the fin walls.

FIG. 9 presents a diagram of a typical expansion device 119. In the embodiment shown the expansion device 119 includes a body providing an air inlet 125, an expansion chamber 200, and an air outlet 126 which make up a passageway for the flow of air through the expansion device 119. The expansion device body includes two openings at which the air inlet and outlet are connected. An inlet passageway is formed between the air inlet 125 and the expansion chamber 200. A constriction 210 is located in the inlet passageway before the expansion chamber 200. The expansion chamber provides an increased volume for the working fluid to expand. An outlet passageway is formed between the expansion chamber 200 and the outlet 126.

The operation of the closed cooling system described herein is as follows. Vacuum pump unit 116 provides a vacuum to the system of conduits 120 and thereby to each expansion device 119 to generate a flow of coolant air through the expansion device 119. At each expansion device, coolant air is drawn from the computer cabinet into the expansion device inlet 125 where it is cooled by expansion and delivered to the heat exchanger through expansion device outlet 126 and heat exchanger inlet 127. The pre-cooled air is then drawn into the attached heat exchanger air inlet 127 and into an adjacent corrugation channel. The pre-cooled air is then drawn laterally across the heat exchanger through the lanced perforations 140 in metal fin 132 and exits the heat exchanger assembly through outlet 128 into conduit 120, as is shown in the cut away view of the CPU heat exchanger illustrated in FIG. 6. Arrows 142 illustrate the direction of air flow through the heat exchanger assembly.

To facilitate the installation, removal and replacement of processor boards, such as board 104, coolant air inlet and outlet tubes 127 and 128 and expansion device 119 are designed to cooperate with corresponding air coupling devices 160. This structure permits connection or disconnection of the board mounted components with the cooling system concurrently with the electrical connection of the board mounted components with the system backpanel 112.

An air coupling device 160 is shown in the sectional views of FIGS. 7 and 8. The air coupling device comprises a housing 162 which can be plastic, piston 164 and metal spring 166. The housing 162 is a cylinder having an opening 168 at one end for receiving air outlet tube 128. A second opening 170 is provided in the wall of the cylindrical housing 162 near the open end of the housing 162. This second opening 170 is mated to conduit 120. Piston 164 is installed within cylindrical housing 162 with spring 166 located between the piston 164 and the closed end of housing 162. Spring 166 urges piston 164 into a first position wherein opening 168 is sealed closed by the end of the piston. Piston 164 is moveable into a second position, with spring 166 depressed, such that an air passageway between openings 168 and 170 is created. Piston 164 is placed into this second position through the insertion of air outlet tube 128 into opening 168. A hole 178 is provided in the wall of outlet tube 128 near the end of the tube so that once air outlet tube 128 is fully inserted into opening 168, coolant air can be drawn into conduit 120, through opening 170 and hole 178 from the air outlet tube.

Air coupling devices 161, similar to air coupling devices 160, are provided for the connection or removal of heat exchangers and expansion devices into the cooling system without interference with the operation of the cooling system whenever a processor board, such as processor board 104, is installed into or removed from backpanel 112. Should a processor board containing heat exchangers be removed, the associated air coupling devices seal the cooling system to prevent a degradation in cooling system performance. Remaining installed processor boards continue to receive the cooling airflow.

It can thus be seen that there has been provided by the present invention a focused air cooling system for a multi-processor computer system which employs both an expansion device and a high efficiency heat exchanger attached to each processor within the multi-processor computer system. The cooling system as described provides a consistent cooling air flow to the processors within the computer system thereby establishing a stable processor chip temperature. Additionally, the system of heat exchangers reduces the need for fans to cool other components in the computer system. The heat exchanger utilized within the described cooling system features a very low profile, as much as a third of the size of a common heat sink, and does not extend beyond the perimeter of the attached processor chip, as many common heat sinks often do. The described system improves cooling by better than four times that of current pin fin heat sinks.

Although one embodiment of the invention has been described, it will be understood that various changes may be made within the scope of the appended claims. For example, components other than the computer system CPUs may also be cooled by the present invention. Additionally, one expansion device may be used to supply several heat exchangers with cooled air.

Further, a cooling air flow can be generated through the utilization of a compressor unit rather than a vacuum pump. The high pressure air provided by the air compressor would be directed to each expansion device through conduit network 120. Use of a compressor rather than a vacuum pump may reduce cooling efficiency slightly, however, as the compression process heats the cooling air.

What is claimed is:

1. An electrical component cooling system, comprising:
   means for generating a flow of air;
   an expansion device for cooling the flow of air to provide a cooled airflow;
   a heat exchanger in thermal contact with the component and in communication with and attached proximate to said expansion device, the heat exchanger comprising a hollow body formed of a thermally conductive material for attachment to said component, and a cooling structure, thermally attached to said hollow body and formed of a thermally conductive material, the cooling structure for providing a surface area exposed to the cooled airflow; and
   a conduit having a first end connected to said air flow generating means and a second end connected to said heat exchanger for providing a cooled airflow pathway from said expansion device to said airflow generating means.

2. The component cooling system of claim 1 wherein the heat exchanger further comprises an airflow inlet and an airflow outlet provided through the walls of said heat exchanger.

3. The component cooling system of claim 2 wherein said internal cooling structure comprises a corrugated metal fin being periodically lanced to provide passage of a cooled airflow throughout said corrugated metal fin.

4. The component cooling system of claim 3 wherein the airflow inlet and the airflow outlet being located to permit a coolant airflow path through said heat exchanger for maximizing the cooled airflow contact with the cooling structure surface area.

5. The component cooling system of claim 1 wherein the first end of the conduit is attached to the airflow generating means and the second end of the conduit is attached to the expansion device.

6. The component cooling system of claim 5 wherein the expansion device is removably attached to the conduit.

7. The component cooling system of claim 5 wherein the airflow comprises pressurized refrigerant.

8. The component cooling system of claim 1 wherein the airflow comprises air.

9. The component cooling system of claim 1 wherein the heat exchanger is removeably attached to the expansion device.

10. The component cooling system of claim 9 wherein the expansion device is attached to heat exchanger by an air coupling.

11. The component cooling system of claim 1 wherein the heat exchanger is removeably attached to the conduit.

12. An electrical component cooling system for use in a computer, comprising:
   a vacuum pump unit for generating an airflow;
   a heat exchanger in thermal contact with the component, said heat exchanger comprising:
     a hollow body formed of a thermally conductive material for attachment to said component, and; an internal cooling structure, thermally attached within said hollow body and formed of a thermally conductive material, for providing an increased surface area which is exposed to the airflow;

an expansion device in communication with and attached proximate to said HEX, said expansion device adapted to provide a cooled airflow to said heat exchanger; and a conduit having a first end which is connected with said vacuum pump unit and a second end which is connected to said heat exchanger for providing a cooled airflow pathway from said heat exchanger to said vacuum pump unit.

13. The component cooling system of claim 12 wherein the heat exchanger is removeably attached to the expansion device.

14. The component cooling system of claim 12 wherein the heat exchanger is removeably attached to the conduit.

* * * * *